(12) United States Patent
Kobayashi et al.

(10) Patent No.: US 6,181,718 B1
(45) Date of Patent: Jan. 30, 2001

(54) ELECTRONICALLY COOLED SEMICONDUCTOR LASER MODULE WITH MODIFIED GROUND LINE INDUCTANCE

(75) Inventors: Masaki Kobayashi, Neyagawa; Hiroyuki Asakura, Osaka; Masanori Iida, Katano, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/003,949

(22) Filed: Jan. 8, 1998

(30) Foreign Application Priority Data

Jan. 8, 1997 (JP) .................................................. 9-001311
Sep. 3, 1997 (JP) .................................................. 9-238575

(51) Int. Cl.$^7$ ..................................................... H01S 5/024
(52) U.S. Cl. ........................ 372/34; 372/38.1; 372/38.08; 385/92
(58) Field of Search ........................ 385/88–94; 372/34, 372/38.05, 38.08, 38.1

(56) References Cited

U.S. PATENT DOCUMENTS

| | | | |
|---|---|---|---|
| 4,254,621 | * 3/1981 | Nagumo | 60/282 |
| 4,267,559 | * 5/1981 | Johnson et al. | 257/99 |
| 4,834,491 | * 5/1989 | Aoki et al. | 385/94 |
| 4,873,566 | * 10/1989 | Hokanson et al. | 257/98 |
| 4,912,715 | * 3/1990 | Aoki et al. | 372/36 |
| 4,922,822 | * 5/1990 | Bierschenk et al. | 136/204 |
| 5,005,178 | * 4/1991 | Kluitmans et al. | 372/36 |
| 6,023,481 | * 2/2000 | Kuribayashi et al. | 372/34 |

FOREIGN PATENT DOCUMENTS 2130986  5/1990  (JP) .

* cited by examiner

*Primary Examiner*—Rodney Bovernick
*Assistant Examiner*—Michael J Stahl
(74) *Attorney, Agent, or Firm*—Wenderoth, Lind & Ponack, L.L.P

(57) ABSTRACT

The invention provides a semiconductor laser module with an electronic cooling device prevented from experiencing a lowering of the optical frequency response characteristic level in a band used for public communications. By changing the inductance of the ground line between module package and chip-mounted carrier of the semiconductor laser module, the resonance frequency of a resonance circuit made up by including the ground line is shifted so as to deviate from the frequency band of public communications used by a modulation signal transmitting device.

26 Claims, 13 Drawing Sheets

ELECTRONICALLY COOLED SEMICONDUCTOR LASER MODULE WITH MODIFIED GROUND LINE INDUCTANCE

BACKGROUND OF THE INVENTION

1. Field of the Invention

The present invention relates to a semiconductor laser module with an electronic cooling device, and more particularly to a semiconductor laser module of a direct modulation system in which a high-frequency input signal is modulated directly into an optical signal.

2. Description of the Prior Art

In recent years, the semiconductor laser module has been under energetic attempts for applications to such communication fields as CATV and public communication that deal with signals of microwave/semi-microwave frequency range, giga bit high-speed digital signals, and other high-speed modulation signals, so that the semiconductor laser module has begun to be put into practical use. Particularly for short- and middle-distance transmission ranging from several hundreds of meters to several kilometers involving less accumulation of noise and signal distortions, the direct intensity modulation system in which a high-frequency signal is modulated directly into an optical signal as a modulation signal is suitable. In such a semiconductor laser module, oscillation characteristics of the semiconductor laser have a large temperature dependency, so that shifts of threshold current density or oscillation wavelength may take place depending on temperature variation. Therefore, in order to obtain a stable laser oscillation, it is essential to maintain laser diodes at a constant temperature. Thus, cooling devices such as a Peltier-element electronic cooling device is used to control the temperature of the laser diodes.

In prior-art semiconductor laser modules, module components such as the electronic cooling device and the ground line form a resonance circuit. For example, as shown in FIG. 20, the circuit resonates with an input modulation signal in a frequency band around 1.6 GHz, causing in some cases a phenomenon that the optical frequency response level would lower.

For this reason, in public communications in which frequencies close to the aforementioned frequency band such as 1.5 GHz band or 1.9 GHz band are frequently used, or in high-speed digital communications in which transmission rates close to the aforementioned frequency band are used, it has been difficult for such semiconductor laser modules to ensure a sufficient modulation signal.

SUMMARY OF THE INVENTION

An object of the present invention is to provide a semiconductor laser module with an electronic cooling device in which the resonance frequency of the semiconductor laser module is shifted so as to prevent the lowering of optical frequency response level in bands employed for public communications.

As a result of keen examinations, the inventors have found that the above object can be achieved by changing the inductance of a ground line between a module package and a chip-mounted carrier, thereby shifting the resonance frequency of the resonance circuit including the ground line so as to deviate the resonance frequency from the frequency band of public communications employed by a modulation signal transmission device, and thus completed the present invention.

Therefore, the present invention provides a semiconductor laser module with an electronic cooling device, comprising at least: a semiconductor laser diode; a chip-mounted carrier on which the semiconductor laser diode is mounted; and electronic cooling device on which the chip-mounted carrier is mounted, and which absorbs heat from the chip-mounted carrier; a module package in which the electronic cooling device is mounted on its inner bottom portion and from which the heat absorbed by the electronic cooling device is released; a modulation signal transmitting device operable to an input modulation signal of a specified frequency to the semiconductor laser diode; and a ground line for electronically connecting the module package and the chip-mounted carrier to each other; wherein an inductance of the ground line is changed so that resonance frequency of a resonance circuit made up by including the ground line is shifted so as to deviate from a specified frequency band used by the modulation signal transmitting device.

In the resonance circuit generated in the semiconductor laser module with an electronic cooling device, the resonance frequency of the resonance circuit can be changed by changing the inductance of the ground line that connects the module package and the chip-mounted carrier to each other. As a result, the resonance frequency can be shifted to a higher band or a lower band so as to deviate from the frequency band of public communications used in semiconductor laser module, by which the optical frequency response level in the frequency band used for public communications can be prevented from lowering.

Preferably, the chip-mounted carrier and the module package are electrically conductive.

Also, the present invention provides a semiconductor laser module with an electronic cooling device, wherein the ground line comprises a conductive first connecting device projectively extending from an inner bottom portion of the module package to near the chip-mounted carrier and having a large cross-sectional area, and a conductive second connecting device functioning to connect the first connecting device and the chip-mounted carrier to each other having a small cross-sectional area, and wherein the inductance of the ground line is reduced so that the resonance frequency is shifted to a band higher than the frequency band.

With the arrangement that the ground line comprises a conductive first connecting device projectively extending directly from an inner bottom portion of the module package to near the chip-mounted carrier and having a large cross-sectional area, and a conductive second connecting device operable to connect the first connecting device and the chip-mounted carrier to each other and having a small cross-sectional area, and by virtue of the large cross-sectional area of the first connecting device a parasitic inductance generated in the ground line can be reduced. Besides, since the first connecting device projectively extends to near the chip-mounted carrier, the distance between the first connecting device and the chip-mounted carrier is shortened, so that the second connecting device even with a small cross-sectional area can be reduced in length, with the result of a reduced parasitic inductance. Thus, the parasitic inductance generated in the whole ground line can be reduced, so that the resonance frequency of the resonance circuit made up by including the ground line can be shifted to a higher band so as to deviate from the specified frequency band used by the modulation signal transmitting device.

Meanwhile, by virtue of the small cross-sectional area of the second connecting device, it also becomes possible to suppress the circulating flow of heat that transfers from the module package to the chip-mounted carrier by passing through the first connecting device.

Therefore, by the adoption of such a ground line structure comprising the first connecting device and the second connecting device the parasitic inductance generated in the ground line can be reduced while the circulating flow of heat from the module package to the chip-mounted carrier is prevented. Thus, it becomes possible to shift the resonance frequency of the resonance circuit of the semiconductor laser module to a higher band so as to deviate from the specified frequency band used by the modulation signal transmitting device.

In particular, when the first connecting device is formed on the inner bottom portion of the conductive module package connected directly to the ground surface provided outside, the resonance frequency can be shifted to a higher band with better reproducibility while preventing the occurrence of unnecessary parasitic components in the ground line, as compared with a case where the first connecting device is formed, for example, on the side wall of the module package.

Preferably, the first connecting device is formed integrally with the inner bottom portion of the module package.

Thus, by forming the first connecting device integrally with the inner bottom portion of the module package, the semiconductor laser module with an electronic cooling device is improved in reliability, while its fabrication process can be simplified by cutting out the fitting process of the first connecting device.

The first connecting device may comprise a connection bottom portion which is formed out of the inner bottom portion of the module package so as to projectively extend to a height near a top surface of the chip-mounted carrier and which functions to connect the second connecting device to the top surface of the chip-mounted carrier.

This is because such a structure of the first connecting device makes it possible to improve the durability to shocks and the like.

Preferably, the first connecting device is a platy metallic block fixed to the module package by a removable fixing device.

Whereas the fabricating process of the semiconductor module involves alignment of the Peltier-element electronic cooling device, chip-mounted carrier, condenser lens and the like, for which optical-axis adjustment is required, the first connecting device can be fitted after fixedly setting these members in place by virtue of the arrangement that the first connecting device is fixed to the module package by the removable fixing device. As a result, the working space can be ensured.

Preferably, the platy metallic block is made from an alloy composed mainly of nickel, iron and cobalt or an alloy composed mainly of copper and tungsten.

When the platy metallic block is made from an alloy composed mainly of nickel, iron and cobalt, the semiconductor laser module can be produced with low price. When the platy metallic block is made from an alloy composed mainly of copper and tungsten, the metallic block can be improved in both electrical conductivity and strength.

Also, the present invention provides a semiconductor laser module with an electronic cooling device, wherein the ground line comprises a conductive second connecting device operable to connect the module package and the chip-mounted carrier to each other and having a small cross-sectional area, or a third connecting device provided on the module package and having a specified inductance value, and a conductive second connecting device which is operable to connect the third connecting device and the chip-mounted carrier to each other and which has a small cross-sectional area, and wherein the inductance of the ground line is increased so that the resonance frequency is shifted to a band lower than the frequency band.

Thus, by increasing the inductance of the ground line, it becomes possible to shift the resonance frequency of the resonance circuit to a lower band so as to deviate from the frequency band of public communications used by the semiconductor laser module, and also possible to prevent any lowering of the optical frequency response level in the frequency band used for public communications.

Meanwhile, by virtue of the small cross-sectional area of the second connecting device constituting the ground line, it also becomes possible to suppress the circulating flow of heat that transfers from the module package to the chip-mounted carrier.

Preferably, the inductance of the ground line is 10 nH or more.

By the ground line having an inductance of 10 nH or more, the resonance frequency can be shifted to a lower band so as to deviate from the frequency band of public communications used by the semiconductor laser module, so that the optical frequency response level can be effectively prevented from lowering in the band used for public communications.

Preferably, the third connecting device comprises one or more in combination selected from among a group consisting of coil, inductance chip, lead line, wire and metal transmission line.

By using these, the inductance of the first connecting device can be easily increased.

Preferably, the second connecting device comprises a bonding wire or a ribbon wire.

By forming the second connecting device from a bonding wire or a ribbon wire, the ground line having a small cross-sectional area can be easily formed, so that the circulating flow of heat from the module package to the chip-mounted carrier through the ground line can be effectively prevented.

Also, the present invention provides a semiconductor laser module with an electronic cooling device, wherein the ground line comprises a conductive first connecting device projectively extending from the module package to near the chip-mounted carrier and having a large cross-sectional area, and a conductive second connecting device functioning to connect the first connecting device and the chip-mounted carrier to each other and having a small cross-sectional area, and wherein the resonance frequency is shifted so as to deviate from the frequency band.

With the arrangement that the ground line comprises a conductive first connecting device projectively extending directly from the module package to near the chip-mounted carrier and having a large cross-sectional area, and a conductive second connecting device functioning to connect the first connecting device, a parasitic inductance generated in the ground line can be reduced. Besides, since the first connecting device projectively extends to near the chip-mounted carrier, the distance between the first connecting device and the chip-mounted carrier is shortened, so that the second connecting device even with a small cross-sectional area can be reduced in length, with the result of a reduced parasitic inductance. Thus, the parasitic inductance generated in the whole ground line can be reduced, so that the resonance frequency of the resonance circuit made up by including the ground line can be shifted so as to deviate from the specified frequency band used by the modulation signal transmitting device.

Meanwhile, by virtue of the small cross-sectional area of the second connecting device, it also becomes possible to suppress the circulating flow of heat that transfers from the module package to the chip-mounted carrier by passing through the first connecting device.

Therefore, by the adoption of such a ground line structure comprising the first connecting device and the second connecting device, the parasitic inductance generated in the ground line can be reduced while the circulating flow of heat from the module package to the chip-mounted carrier is prevented. Thus, it becomes possible to shift the resonance frequency of the resonance circuit of the semiconductor laser module to a higher band so as to deviate from the specified frequency band used by the modulation signal transmitting device.

Preferably, the first connecting device is a platy metallic block fixed to the module package by a removable fixing device.

Whereas the fabricating process of the semiconductor module involves alignment of the Peltier-element electronic cooling device, chip-mounted carrier, condenser lens and the like, for which optical-axis adjustment is required, the first connecting device can be fitted after fixedly setting these members in place by virtue of the arrangement that first connecting device is fixed to the module package by the removable fixing device. As a result, the working space for the alignment can be ensured.

Preferably, the first connecting device comprises a first platy metallic block fixed to the module package and a second platy metallic block removably fixed to the first platy metallic block.

Thus, when the first connecting device is formed by previously fixing the first platy metallic block to the module package, performing the alignment of the members, and thereafter fixing the second platy metallic block to the first platy metallic block, the first connecting device can be fitted more easily, as compared with the case where the first connecting device is fixed directly to the wall surface of the module package.

Preferably, the platy metallic block is made from an alloy composed mainly of nickel, iron and cobalt or an alloy composed mainly of copper and tungsten.

When the platy metallic block is made from an alloy composed mainly of nickel, iron and cobalt, the semiconductor laser module can be produced with low price. When the platy metallic block is made from an alloy composed mainly of copper and tungsten, the metallic block can be improved in both electrical conductivity and strength.

Preferably, the second connecting device comprises a bonding wire or a ribbon wire.

By forming the second connecting device from a bonding wire or a ribbon wire, the ground line having a small cross-sectional area can be easily formed at the second connecting device part, so that the circulating flow of heat from the module package to the chip-mounted carrier through the ground line can be effectively prevented.

Preferably, the electronic cooling device comprises dielectric substrates being kept in contact with the chip-mounted carrier and the module package, respectively, and made from a ceramic material composed mainly of any one of alumina ($Al_2O_3$), aluminum nitride (AlN) and calcium titanate ($CaTiO_3$), and a Peltier element sandwiched between the dielectric substrates.

By using alumina or the like for the dielectric substrates of the electronic cooling device, heat absorption/heat radiation efficiency can be improved by virtue of the improvement in heat transfer characteristic as well as in strength. Thus, stable operation of the semiconductor laser module can be ensured.

Preferably, the modulation signal transmitting device comprises a metal transmission line formed on a ceramic insert passing through the module package or a coaxial connector fixed to the module package.

Also, an optical fiber for leading output light derived from the semiconductor laser diode to outside may be connected to the semiconductor laser diode.

DETAILED DESCRIPTION OF THE INVENTION

Figure 17:
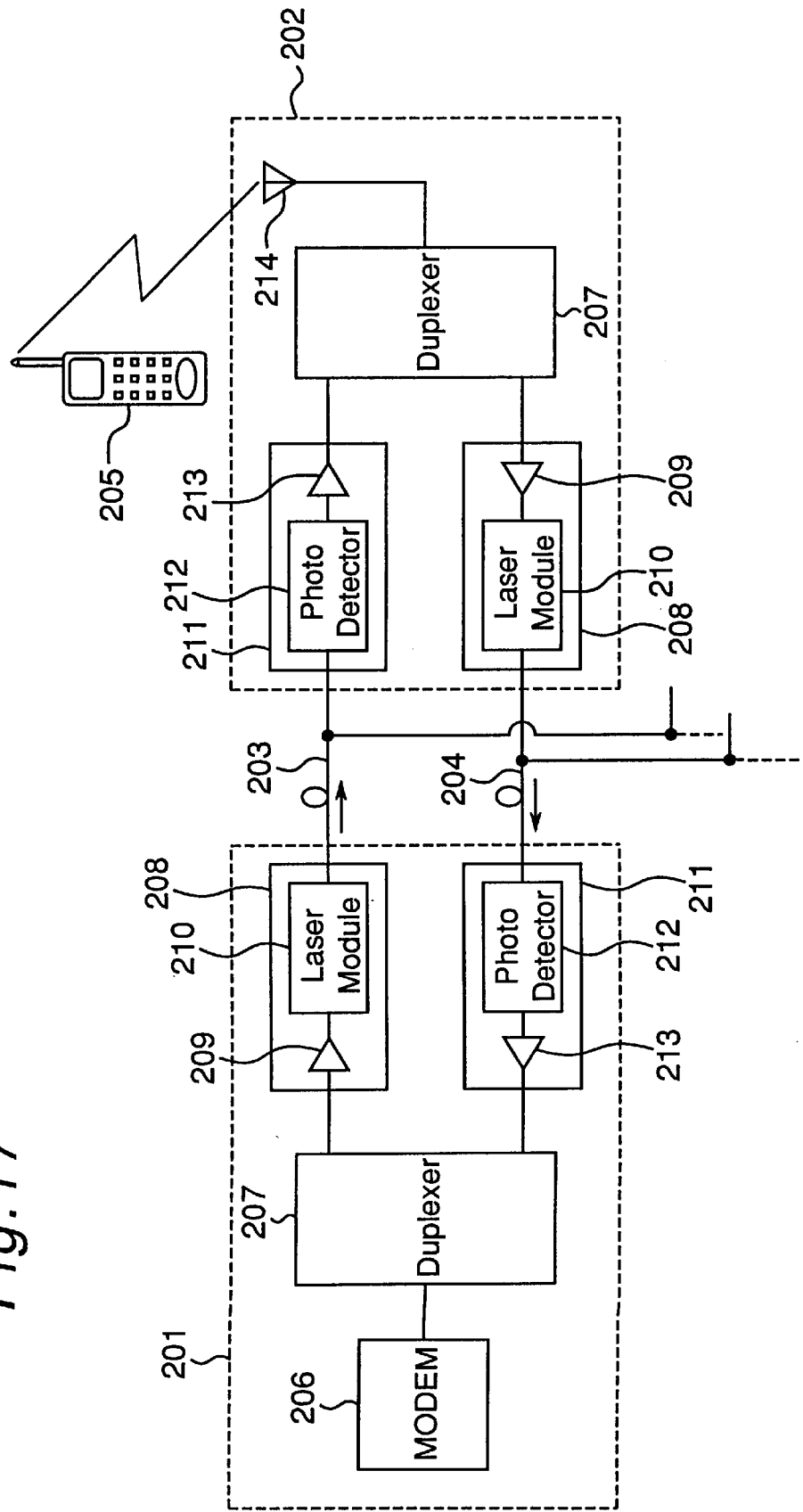
FIG. 17 shows an example of the optical communications system employing a semiconductor laser module of the invention.

Embodiment 1:

FIG. 17 shows an example of the optical communications system to which a semiconductor laser module 210 of the present invention is applied.

In this system, a master station 201 and a slave station 202 remote from each other are connected by optical fibers 203, 204, and the mobile station 205 such as portable phones and the slave station 202 are communicated with each other via radio waves.

In the master station 201, an electric signal modulated by a modem 206 is fed to an optical transmitter 208 through a duplexes 207. In the optical transmitter 208, this electric signal is amplified by an amplifier 209 so as not to cause any distortion, and is fed to the semiconductor laser module 210. In the semiconductor laser module 210, this electric signal is converted into an optical signal and transmitted to the optical fiber 203.

This optical signal is transmitted within the optical fiber 203 reaching an optical receiver an optical receiver 211 of the slave station 202. In the optical receiver 211, the optical signal is converted into an electric signal by a photodetector 212, and the resulting electric signal is amplified by an amplifier 213. The amplified electric signal passes through the duplexers 207 being emitted as a radio wave from an antenna 214. The emitted radio wave is received by a mobile station 205, and reproduced into information such as sound and data.

Conversely, a radio wave transmitted from the mobile station 205 is received by the antenna 214 of the slave station 202, passing through the duplexers 207, being converted into an optical signal by the optical transmitter 208, and transmitted to the optical fiber 204. The optical signal is transmitted within the optical fiber 204, converted into an electric signal by the optical receiver 211 of the master station 201, passing through the duplexers 207, and is provided to the modem 206.

Figure 18:
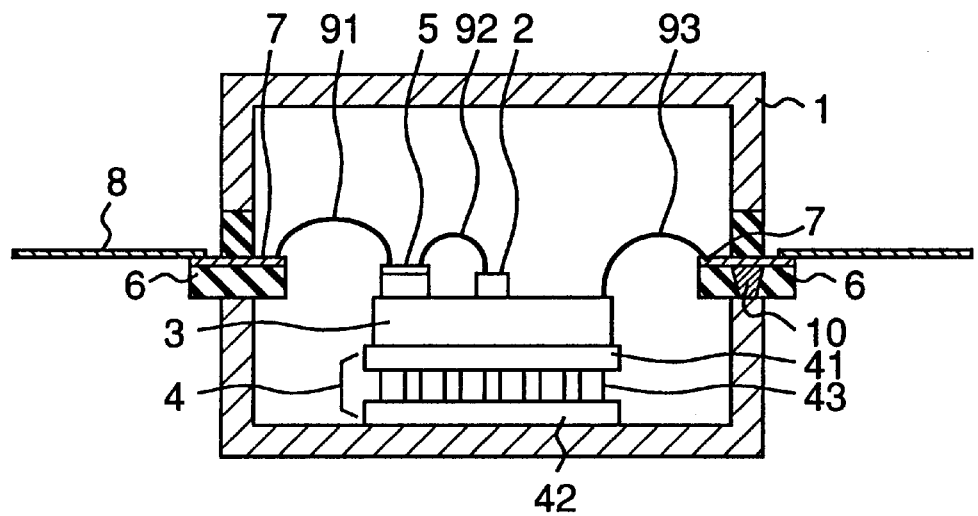
FIG. 18 is cross-sectional arrangement diagram of a semiconductor laser module with an electronic cooling device according to the prior art.

FIG. 18 shows an example of the prior-art semiconductor laser module using an electronic cooling device to be used in such an optical communications system. In the figure, reference numeral 1 denotes a butterfly type module package, 2 denotes a semiconductor laser diode, 3 denotes a chip-mounted carrier, 4 denotes a Peltier-element electronic cooling device, 5 denotes a electrode pad, 6 denotes a ceramic insert, 7 denotes a metallized transmission line patterned into a ceramic insert form, 8 denotes a lead pin serving as a modulation signal input terminal, 91, 92 and 93 denote bonding wires, and 10 denotes a hole for connecting the metallized transmission line to the module package.

The Peltier-element electronic cooling device 4 comprises a Peltier effect element 43 using a pin junction sandwiched between a first dielectric plate substrate 41 and a second dielectric plate substrate 42.

In the prior-art semiconductor laser module as shown in FIG. 18, the semiconductor laser diode 2 is first excited and oscillated with a DC drive current inputted through the lead pin, and subsequently an analog high-frequency or high-speed digital signal is inputted also through the lead pin so that the semiconductor laser diode 2 is directly modulated. Although omitted in the figure, an output optical signal from the semiconductor laser diode is led out of the module package by optical fiber.

When a continuous excitation and oscillation is lasted, loss portion in electro-optical conversion by the semiconductor laser diode 2 is converted into heat, causing the temperature of the semiconductor laser diode 2 to increase. To avoid such a temperature increase, a temperature detector such as a thermistor-resistor is installed around the semiconductor laser diode 2, by which temperature around the semiconductor laser diode is detected so that the supply current to the Peltier-element electronic cooling device 4 is controlled. The Peltier-element electronic cooling device 4 is controlled in heat absorption/heat radiation depending on the supply power, so that the semiconductor laser diode is normally held at a constant temperature.

Normally, the first dielectric plate substrate 41 provided on the semiconductor laser diode 2 side fulfills the heat absorption function, while the second dielectric plate substrate 42 provided on the module package 1 side fulfills the heat radiation function.

With the constitution as described above, a temperature increase of the semiconductor laser diode due to the heat generated from the semiconductor laser diode 2 is suppressed so that a stable laser oscillation can be obtained.

Figure 20:
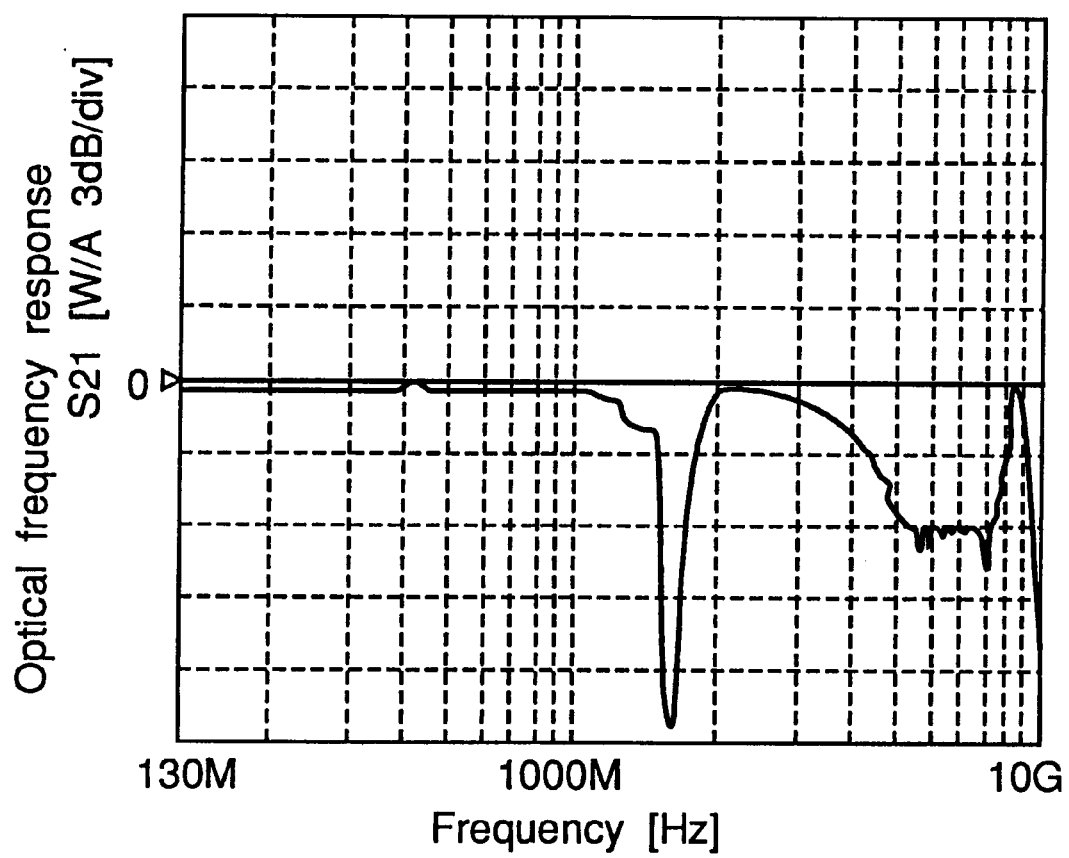
FIG. 20 shows a small-signal optical frequency response characteristic of the semiconductor laser module with an electronic cooling device according to the prior art.

However, as described before, in the prior-art semiconductor laser module, module components such as the electronic cooling device and the ground line form a resonance circuit, so that the circuit resonates with an input modulation signal in a frequency band around 1.6 GHz, causing in some cases a phenomenon that the optical frequency response level would lower (FIG. 20).

Figure 19:
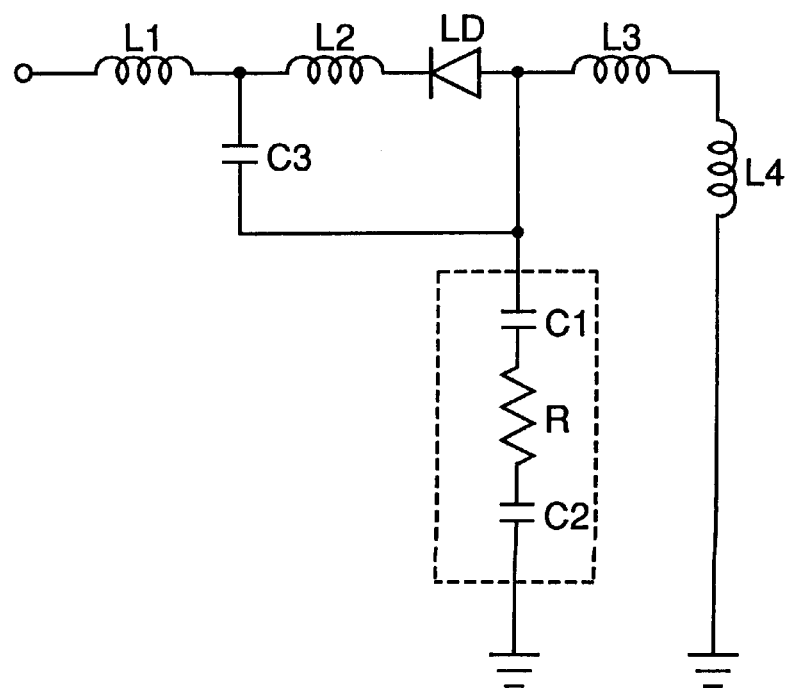
FIG. 19 is an equivalent circuit diagram of the semiconductor laser module with an electronic cooling device according to the prior art.

Thus, as a result of discussing the above semiconductor laser module, it is found that the electrical equivalent circuit diagram of the semiconductor laser module can be expressed by FIG. 19.

More specifically, the signal line is relayed by a lead pin and a ceramic-insert shaped transmission line and, via an inductance L1 by means of the bonding wire 91 and a inductance L2 by means of the bonding wire 92, connected to the semiconductor laser diode (LD), where a capacitance component C3 of the electrode pad is added in parallel to the LD.

On the other hand, the ground line runs from the chip-mounted carrier 3 to the bonding wire 93 and the metallized transmission line 7 on the ceramic insert 6, and passed via the hole 10, being connected to the conductive package module. The ground line comprises an inductance L3 of the bonding wire 93 and an inductance component L4 of the package including an inductance of the metallized transmission line 7 patterned on the ceramic insert 6, and arranged in parallel to the line of the capacitances C1, C2 of the Peltier-element dielectric plate substrate.

Therefore, in the above electrical equivalent circuit, the resonance frequency of the semiconductor laser module is $$fr = \frac{1}{2\pi}\sqrt{(L3+L4)(C1 \cdot C2/(C1+C2)+C3)} \qquad \text{(Equation 1)}$$

From this Equation 1, it can be considered that reducing the parasitic inductance (L3+L4) of the ground line causes the resonance frequency fr to increase, i.e., causes the resonance frequency to be shifted from 1.6 GHz to a higher band, so that the characteristics in the modulation band around 1.6 GHz can be enhanced.

This being the case, we discussed a device for reducing the (L3+L4) by connecting the chip-mounted carrier and the module package directly to each other with a large-cross-section metal member. However, with this device, because of the direct connection of the module package and the chip-mounted carrier with a large-cross-section metal member, indeed the parasitic inductance (L3+L4) was reduced, but there occurred a heat circulating-flow phenomenon that heat absorbed from the chip-mounted carrier by the Peltier-element electronic cooling device and radiated from the module package is returned to the chip-mounted carrier by passing again through the metal member. This incurred a deterioration of the cooling effect of the laser diode, making it difficult to achieve a stable laser oscillation.

Therefore, the present invention provides a semiconductor laser module with an electronic cooling device, which allows a parasitic inductance (L3+L4) to be reduced without deteriorating the cooling effect of the semiconductor laser module, and which allows the resonance frequency to be shifted to a higher band, and moreover which is structurally and characteristically stable.

Figure 1:
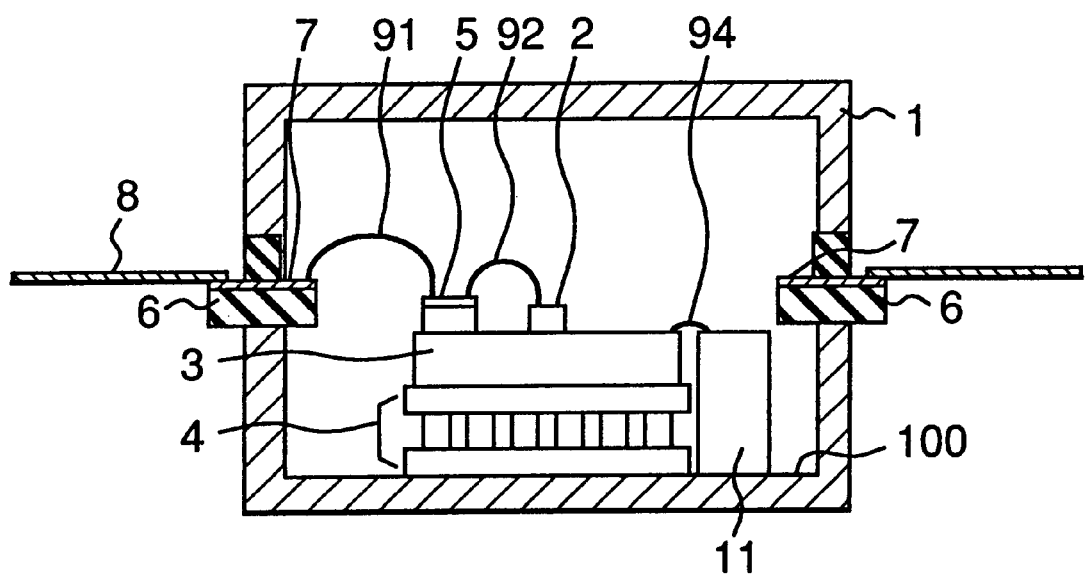
FIG. 1 is a sectional view of a semiconductor laser module with an electronic cooling device according to Embodiment 1 of the invention.

FIG. 1 is a sectional view of a semiconductor laser module according to Embodiment 1 of the present invention. In the figure, the same reference numerals as those of FIG. 18 denote the same or corresponding parts.

In this Embodiment 1, a first connecting device 11 is so structured as to projectively extend from an inner bottom portion of the module package 1 directly to near the top surface of the chip-mounted carrier 3 without intervention of the metallized transmission line 7 or the like, while a second connecting device 94 serves to electronically connect the first connecting device 11 and the chip-mounted carrier 3 to each other and comprises a bonding wire or the like. Accordingly, this structure has a difference that the chip-mounted carrier 3 and the inner bottom portion of the module package 1 are connected to each other via the conductive first and second connecting devices 11, 94, from the prior art structure (FIG. 18) in which they are connected via the bonding wire 93, the metallized transmission line 7 and the hole 10.

In addition, the module package 1 is used in the state that outside of its bottom portion is electrically connected, for example, to a metal casing (ground) of the transmitter unit externally provided. Accordingly, the first connecting device 11 is preferably provided at the inner bottom portion 100 of the module package 1.

More specifically, if the first connecting device 11 is provided at a place other than the inner bottom portion 100 of the module package 1, for example, on a side wall, the ground line would be connected to the first and second connecting devices via the side wall portion of the module package 1 from the inner bottom portion 100 of the module package 1 connected directly to the ground potential, which causes an unnecessary parasitic inductance to take place in the side wall portion of the module package 1. Therefore, even if the inductance is reduced by enlarging the cross section of the first connecting device 11, the occurrence of a parasitic inductance makes it difficult to sufficiently reduce the whole inductance of the ground line.

Thus, in this embodiment, the first connecting device 11 is provided directly on the inner bottom portion 100 of the module package 1 connected directly to the ground potential, so that the occurrence of an unnecessary parasitic inductance is prevented.

Also, if the first connecting device 11 is provided on a side wall of the module package 1, it was found that enough fitting strength can hardly be obtained with good reproducibility, owing to the structure that the first connecting device is bonded to the side wall, and also can hardly be obtained enough reliability because of strength variations with time or the like.

Figure 2:
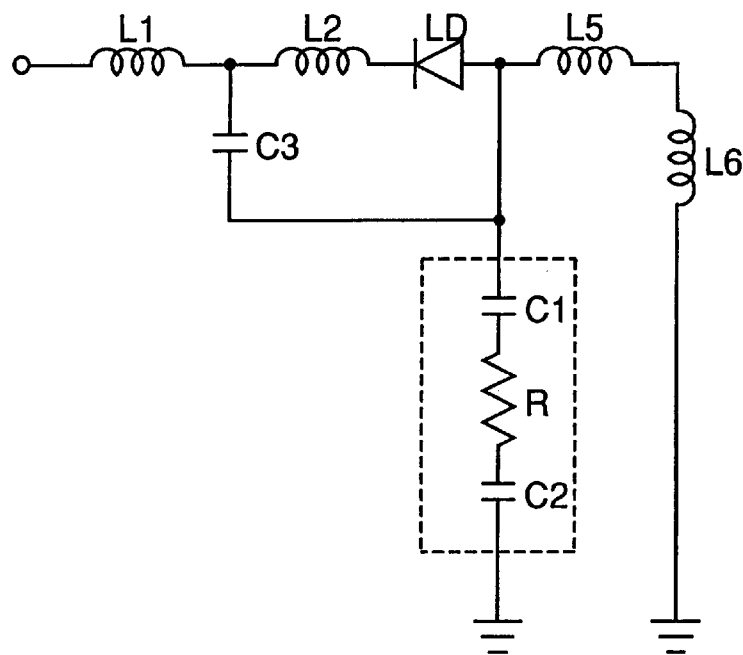
FIG. 2 is an electrical equivalent circuit diagram of the semiconductor laser module with an electronic cooling device according to Embodiment 1 of the invention.

FIG. 2 is an electrical equivalent circuit diagram of the semiconductor laser module shown in FIG. 1. In FIG. 2, the same reference numerals as those of FIG. 19 denote the same circuit elements. As compared with the equivalent circuit of FIG. 19, the inductance L3 generated in the bonding wire 93 and the inductance component L4 generated in the metallized transmission line 7, the hole 10 and the module package 1 have been replaced with an inductance L5 generated in the second connecting device and an inductance L6 generated in the first connecting device.

The resonance frequency of the electrical equivalent circuit shown in FIG. 2 can be expressed by.

$$fr = \tfrac{1}{2}\pi\sqrt{\{(L5+L6)(C1\cdot C2/(C1+C2)+C3)\}} \quad \text{(Equation 2)}$$

In this embodiment, the first connecting device 11 is connected to the inner bottom portion 100 of the module package 1 and is formed of a metallic block having a sufficiently large cross section. As a result, an extremely small inductance is generated in the first connecting device 11 so that the L6 can be reduced.

Also, the first connecting device 11 is so formed as to projectively extend from the inner bottom portion 100 of the module package 1 to near the chip-mounted carrier 3, so that the conductive second connecting device 94 made of, for example, wire bonding that connects the first connecting device 11 and the chip-mounted carrier 3 to each other can be reduced in length. Therefore, even if the second connecting device 94 is formed of a bonding wire or the like having a small cross section, the generation of parasitic inductance depending on the length can be reduced, so that the L5 can be reduced.

Meanwhile, by reducing the cross section of the second connecting device, it becomes possible to prevent the heat circulating-flow phenomenon that heat absorbed from the chip-mounted carrier 3 by the Peltier-element cooling device 4 and radiated from the module package 1 is returned to the chip-mounted carrier 3 by passing through the ground line.

Below is shown a comparison between calculated values of resonance frequency of the semiconductor module having the prior art structure (FIGS. 18, 19) and calculated values of resonance frequency of the semiconductor laser module according to this embodiment (FIGS. 1, 2).

In the prior art structure, the electrode pad 5 is usually made from a material having a low relative dielectric constant such as alumina, the size being 1.8×1.8×1.0 mm, where C3 becomes around 0.26 pF. Also, the upper and lower dielectric plates of the Peltier element 4 are sized 6×10×0.45 mm, where C1 and C2 become around 10.5 pF. The bonding wire 93 is usually formed into six parallel gold wires with a diameter of 25 $\mu$m and length of about 3 mm, where L3 becomes around 0.5 nH. The contained-in-package inductance L4 generated in the metallized transmission line 7, the hole 10 and the module package 1 becomes around 1.2 nH.

Therefore, substituting these values into the Equation 1 results in a resonance frequency fr of around 1.6 GHz, well agreeing with measurement values shown in FIG. 20.

In contrast to this, in this Embodiment 1, C1, C2 and C3 are the same as those of the prior art structure, being around 10.5 pF, 10.5 pF and 0.26 pF, respectively. Also, when six gold wires with a diameter of 25 $\mu$m and a length of 0.5 mm are provided as the second connecting device 94, the inductance L5 generated in the second connecting device 94 becomes around 0.1 nH.

Meanwhile, the inductance component L6 contained in the package including the first connecting device can be estimated to be around 0.1 nH.

Therefore, from Equation 2, it can be understood that the resonance frequency fr is around 4.8 GHz, enabling the avoidance of resonance in a 1–2 GHz channel band.

Figure 3:
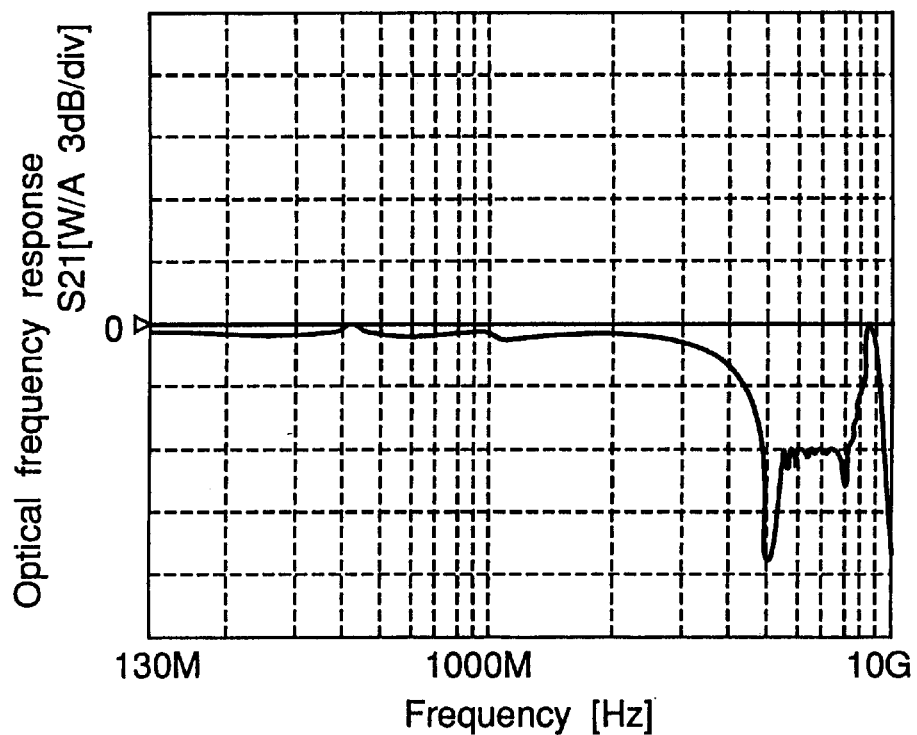
FIG. 3 shows a small-signal optical frequency response characteristic of the semiconductor laser module with an electronic cooling device according to Embodiment 1 of the invention.

FIG. 3 shows measurement results of a small-signal optical frequency response of the semiconductor laser module of this embodiment formed by using the first and second connecting device 11, 94. In the figure, the vertical axis represents an optical frequency response and the horizontal axis represents frequency. As apparent from FIG. 3, the measurement results well agree with the foregoing calculation results, where the center frequency at which the optical frequency response due to the resonance phenomenon is shifted to a higher band, from around 1.6 GHz of the prior art structure to around 5 GHz, by which the margins of modulation characteristic are improved.

Meanwhile, since the second connecting device is a bonding wire having a thin diameter of 25 μm, the heat resistance between the module package 1 and the chip-mounted carrier 3 can be increased.

Accordingly, the heat transfer between them can be suppressed low, which in turn makes it possible to prevent the heat circulating-flow phenomenon that heat radiated from the lower surface of the Peltier-element electronic cooling device to the module package 1 is flowed back to the chip-mounted carrier 3 by passing through the first and second connecting device 11, 94, and therefore to obtain a sufficient cooling effect without decreasing the heat exchange efficiency of the Peltier-element electronic cooling device 4.

As shown above, according to this Embodiment 1, it becomes possible to shift the resonance frequency of the semiconductor module to a higher band without decreasing the heat exchange efficiency of the Peltier element, and to improve the modulation margins, by virtue of the arrangement that the ground line is formed by electrically connecting in series the module package 1 and the chip-mounted carrier 3 to each other with the conductive first connecting device 11 projectively extending from the inner bottom portion 100 of the module package 1 to near the chip-mounted carrier 3 and having a large cross-sectional area, and the conductive second connecting device 94 operable to connect the first connecting device and the chip-mounted carrier to each other, being short, and having a small cross-sectional area.

In particular, in this embodiment, the first connecting device 11 is provided directly on the inner bottom portion 100 of the module package 1 connected directly to the ground potential, by which occurrence of unnecessary parasitic inductance can be prevented and the shift of resonance frequency to a higher band can be effectively achieved. Moreover, the fitting strength of the first connecting device 11 can be obtained with good reproducibility, so that the fabrication of a high-reliability semiconductor module is enabled.

In addition, although bonding wire has been used as the second connecting device 94 in Embodiment 1, ribbon wire may be used alternatively, and the diameter, number and length of the bonding wire are arbitrarily selectable.

The module package is preferably a butterfly type package, and especially preferably a butterfly type package equipped with a ceramic insert passing through opposite side walls of the module package and having a metallized transmission line patterned at its surface.

Furthermore, the modulation signal transmission device may also be implemented by a coaxial connector incorporated into the module package.

Figure 4:
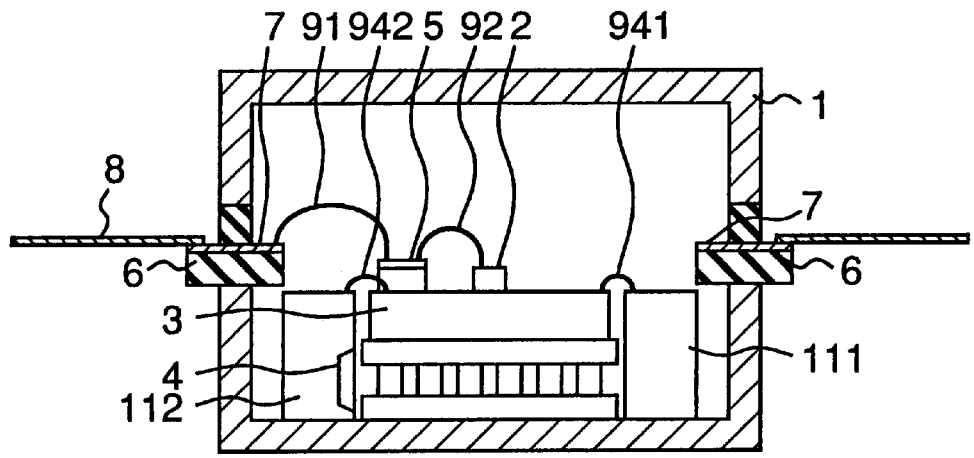
FIG. 4 is a sectional view of a semiconductor laser module with an electronic cooling device to Embodiment 2 of the invention.

Embodiment 2:

FIG. 4 is a sectional view of a semiconductor laser module according to Embodiment 2 of the invention. In the figure, the same reference numerals as those of FIG. 1 denote the same or corresponding parts. This embodiment differs from Embodiment 1 shown in FIG. 1 in that the ground line comprises two parts, 111 and 941, 112 and 942.

Figure 5:
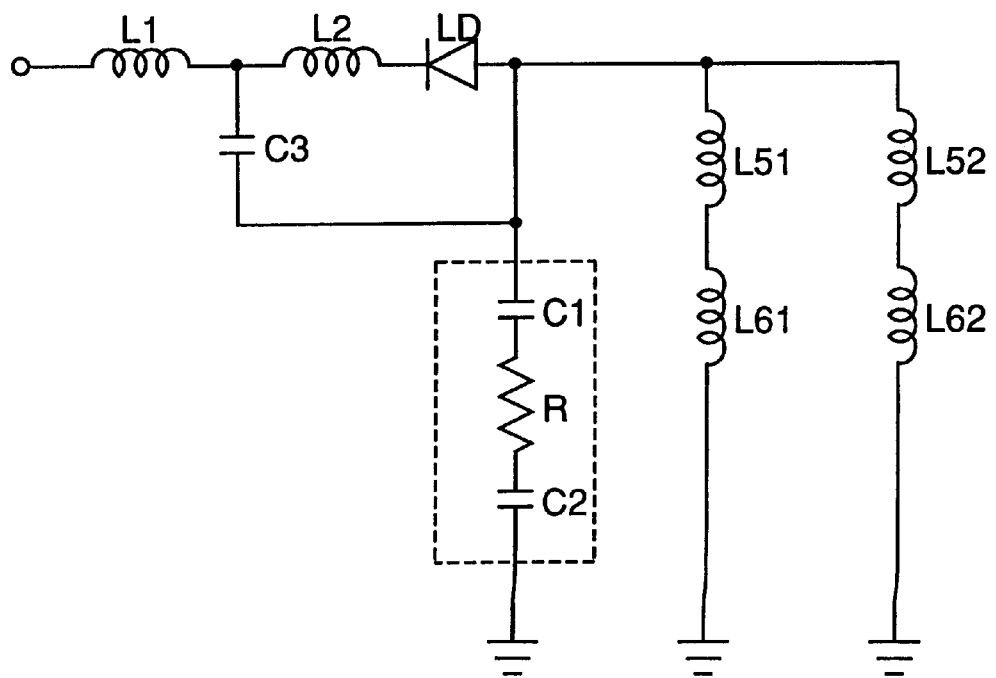
FIG. 5 is an electrical equivalent circuit diagram of the semiconductor laser module with an electronic cooling device according to Embodiment 2 of the invention.

FIG. 5 is an electrical equivalent circuit diagram according to this Embodiment 2. In the figure, the same reference numerals as those of FIG. 2 denote the same or corresponding parts. This embodiment differs from Embodiment 1 shown in FIG. 2 in that the inductances L5, L6 of the ground line are replaced with a parallel arrangement of L51, L61 and L52, L62. Reference numerals L51, L61, L52, L62 denote inductance components, generated in 941, 111, 942, 112, respectively.

The resonance frequency, of the electrical equivalent circuit according to this embodiment can be expressed by $$fr = \tfrac{1}{2}\pi\sqrt{[\{(L51+L61)(L52+L62)/(L51+L61+L52+L62)\}\{C1\cdot C2/(C1+C2)+C3)\}]} \quad \text{(Equation 3)}$$

Given a ground line satisfying that L5=L51=L52 and L6=L61=L62, it becomes possible to make the resonance frequency fr √2 times larger than the resonance frequency obtained in Embodiment 1.

Thus, in Embodiment 2, by providing two sets of the ground line comprising the first and second connecting device, the combined inductance of the ground line can be reduced without decreasing the heat exchange efficiency of the Peltier element, so that the resonance frequency can be shifted to a higher band.

In addition, although the ground line has been provided in two sets in Embodiment 2, it may be provided in three or more sets. In this case, the combined inductance of the ground lines can be further reduced by providing the ground line in more sets, so that the resonance frequency can be shifted to a further higher band.

Figure 6:
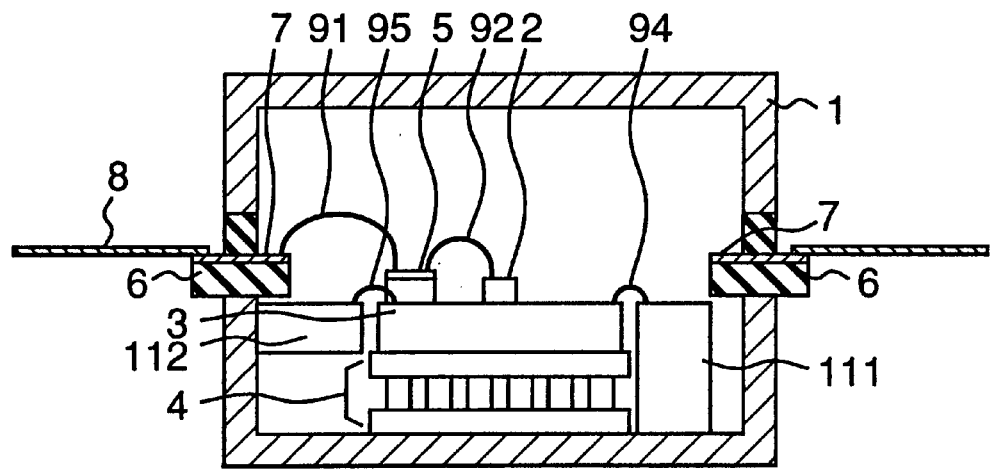
FIG. 6 is a sectional view of a semiconductor laser module with an electronic cooling device according to Embodiment 3 of the invention.

Embodiment 3:

FIG. 6 is a sectional view of a semiconductor laser module according to Embodiment 3 of the invention. In the figure, the same reference numerals as those of FIG. 1 denote the same or corresponding parts. This embodiment differs from Embodiment 1 shown in FIG. 1 in that the ground line further comprises second ground lines 112, 95 connected to the side wall of the module package in addition to the first ground lines 111, 94 connected to the inner bottom portion of the module package.

Figure 7:
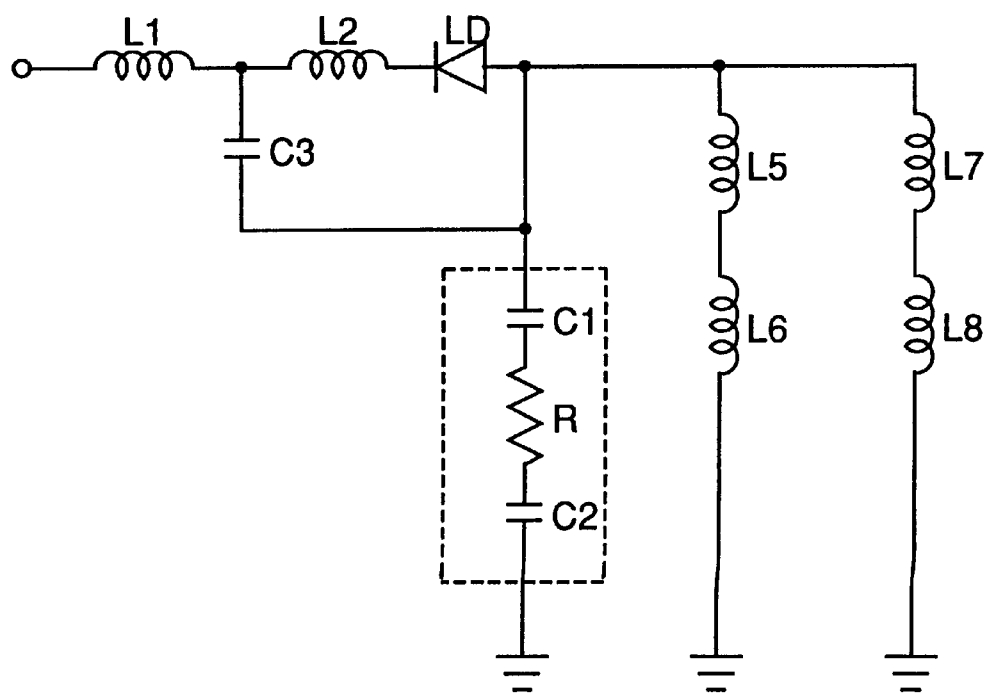
FIG. 7 is an electrical equivalent circuit diagram of the semiconductor laser module with an electronic cooling device according to Embodiment 3 of the invention.

FIG. 7 is an electrical equivalent circuit diagram of the semiconductor laser module according to Embodiment 3. In the figure, the same reference numerals as those of FIG. 2 denote the same or corresponding parts. This embodiment differs from Embodiment 1 in that inductances L7, L8 are added to the inductances L5, L6 of the ground line. L7 and L8 denote inductance components generated in the second connecting device 95 and the first connecting device 112, respectively.

The resonance frequency of the electrical equivalent circuit according to this embodiment can be expressed by $$fr = \tfrac{1}{2}\pi\sqrt{[\{(L5+L6)(L7+L8)/(L5+L6+L7+L8)\}\{C1\cdot C2/(C1+C2)+C3\}]} \quad \text{(Equation 4)}$$

As shown above, the reduction effect of combined inductance due to the parallel placement of connecting device constituting the ground lines can be obtained not only when a plurality of ground lines to be connected to the inner bottom portion of the module package are provided as shown in Embodiment 2, but also when ground lines are set on the side wall of the module package besides at the inner bottom portion of the module package.

Therefore, the positions where the ground lines are set can be selected flexibly so that the flexibility of module construction can be improved.

Thus, in this Embodiment 3, by the ground lines further comprising the second ground lines 112, 95 connected to the side wall of the module package in addition to the first ground lines 111, 94 connected to the inner bottom portion of the module package, the combined inductance of the ground lines can be reduced and the resonance frequency can be shifted to an even higher band, without decreasing the heat exchange efficiency of the Peltier element, as compared with the case of one set of ground line.

Also, the ground lines to be added may also be provided at places other than the inner bottom portion of the module package, in which case the flexibility of the module construction can be improved.

Figure 8:
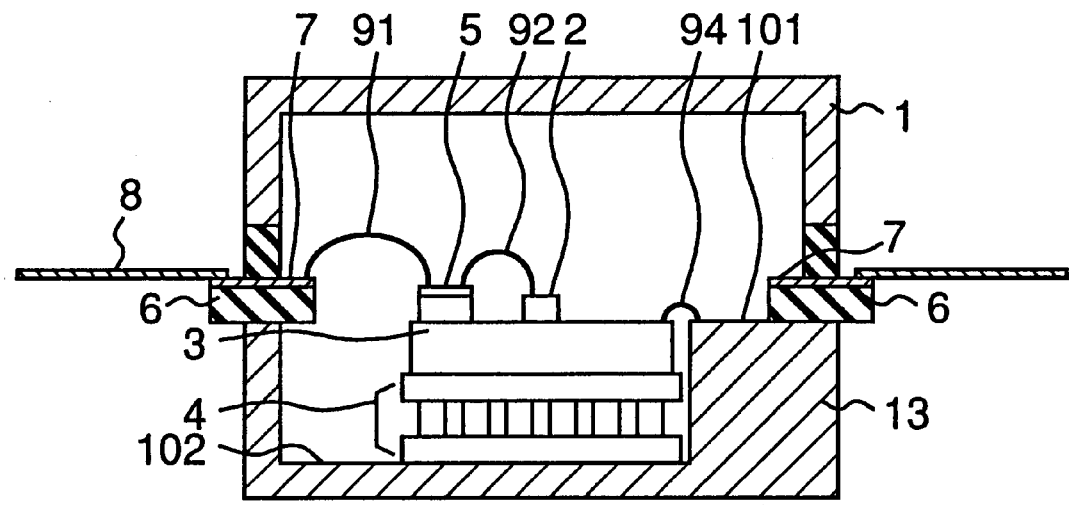
FIG. 8 is a sectional view of a semiconductor laser module with an electronic cooling device according to Embodiment 4 of the invention.

Embodiment 4:

FIG. 8 is a sectional view of a semiconductor laser module according to Embodiment 4 of the invention. In the figure, the same reference numerals as those of FIG. 1 denote the same or corresponding parts. This embodiment differs from Embodiment 1 shown in FIG. 1 in that the module package 1 is integrated with a first connecting device 13 and comprises a first inner bottom portion 101 flush with the top surface of the chip-mounted carrier and a second inner bottom portion 102 for fixing the electronic cooling device 4 on which the chip-mounted carrier 3 is mounted.

The electrical equivalent circuit diagram and the small signal optical frequency response characteristics according to this embodiment are similar to those of Embodiment 1 shown in FIGS. 2 and 3.

Thus, in Embodiment 4, it becomes possible to shift the resonance frequency to a higher band without decreasing the heat exchange efficiency of the Peltier element. Besides, since the first connecting device 13 is integrated with the module package 1 without having any connecting portion, the reliability to shocks is improved and the durability to time lapse deterioration in the connecting portion is also enabled.

Also, since the working process for fitting adjustment of the first connecting device 13 can be omitted, it becomes possible to simplify the fabricating process of the semiconductor module.

Further, since contact inductance can be prevented from occurring due to mal-fitting of the first connecting device 13, it becomes possible to prevent deterioration in the inductance of the ground lines.

In addition, although one first inner bottom portion 101 serving as the first connecting device has been provided, it is also possible to set first inner bottom portions 101 serving as a plurality of the first connecting device.

Figure 9:
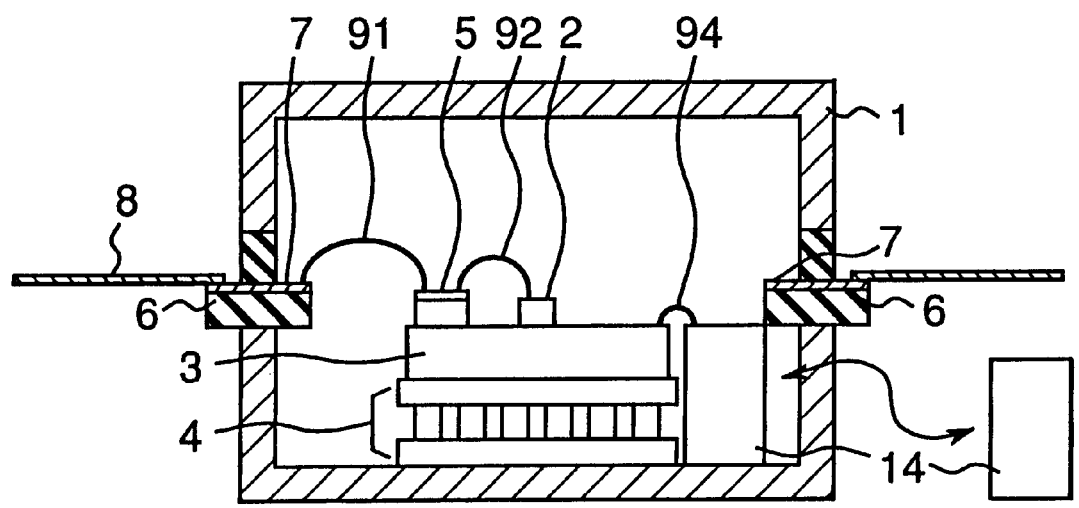
FIG. 9 is sectional view of a semiconductor laser module with an electronic cooling device according to Embodiment 5 of the invention.

Embodiment 5:

FIG. 9 is a sectional view of a semiconductor laser module according to Embodiment 5 of the invention. In the figure, the same reference numerals as those of FIG. 1 denote the same or corresponding parts. This embodiment differs from Embodiment 1 in that the first connecting device is a metallic block 14 fixed to the inner bottom portion of the module package by a removable fixing device.

The electrical equivalent circuit diagram and the small signal optical frequency response characteristics according to this embodiment are similar to those of Embodiment 1 (FIGS. 2 and 3).

Thus, in Embodiment 5, it becomes possible to shift the resonance frequency to a higher band without decreasing the heat exchange efficiency of the Peltier element. Besides, since the metallic block 14 serving as the first connecting device is fitted to the inner bottom portion of the module package 1 by a removable fixing device such as solder connection, it becomes possible to fit the metallic block after aligning the Peltier element electronic cooling device 4, chip-mounted carrier 3, condenser lens, optical isolator, optical fiber and the like, for which optical-axis adjustment is required, and fixedly setting these members in place, in the fabricating process of the semiconductor module, so that the working space can be ensured.

Also, when a need of re-adjustment for the positions of the members has arisen, the metallic block can be easily removed so that the working space can be ensured.

Figure 10:
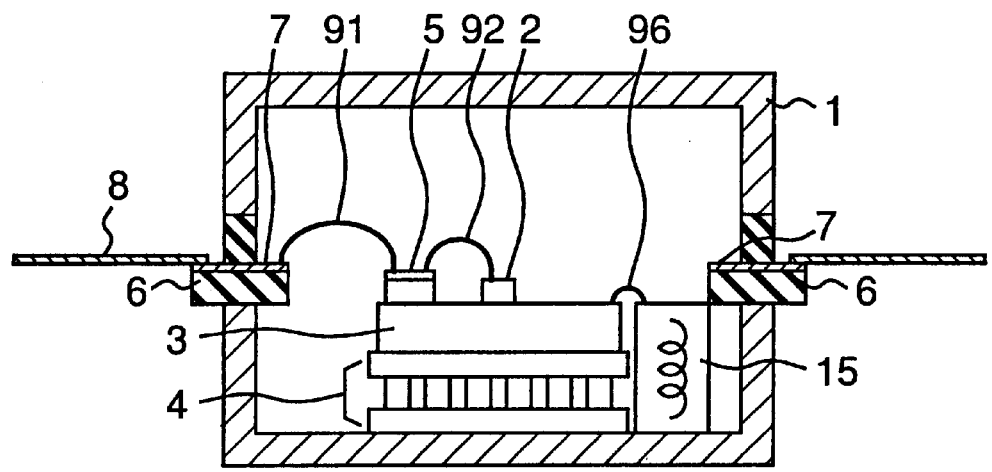
FIG. 10 is a sectional view of a semiconductor laser module with an electronic cooling device according to Embodiment 6 of the invention.

Embodiment 6:

This Embodiment 6 provides a semiconductor laser module with an electronic cooling device in which module the parasitic inductance (L3+L4) of the ground line is increased and the resonance frequency is shifted to a lower frequency band without decreasing the heat exchange efficiency of the Peltier element of the semiconductor laser module and which module is stable in terms of both structure and characteristics. FIG. 10 shows a sectional view of the semiconductor laser module according to Embodiment 6 of the invention. In the figure, the same reference numerals as those of FIG. 1 denote the same or corresponding parts.

The semiconductor laser module according to Embodiment 6 shown in FIG. 10 differs from the semiconductor laser module of the prior art structure shown in FIG. 18 in that the ground line comprises a third connecting device 15 such as a chip-type inductance element having a specified inductance value, and a conductive second connecting device 96 having a small cross-sectional area such as bonding wire.

Figure 11:
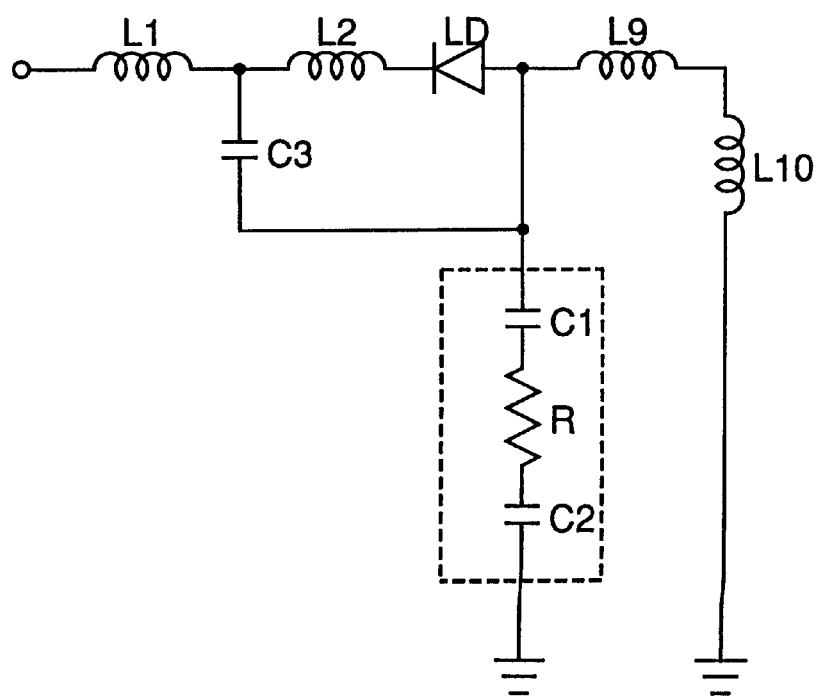
FIG. 11 is an electrical equivalent circuit diagram of the semiconductor laser module with an electronic cooling device according to Embodiment 6 of the invention.

FIG. 11 is an electrical equivalent circuit diagram of the semiconductor laser module according to Embodiment 6 shown in FIG. 10. In the figure, the same reference numerals as those of FIG. 1 denote the same circuit elements, and as compared with the equivalent circuit of FIG. 19, the inductance L3 generated in the bonding wire 93 and the inductance L4 generated in the metallized transmission line 7, the hole 10 and the module package 1 have been replaced with an inductance L9 generated in the second connecting device and an inductance L10 generated in the third connecting device and the module package 1.

The resonance frequency of the electrical equivalent circuit according to this Embodiment 6 can be expressed by $$fr=\tfrac{1}{2}\pi\sqrt{\{(L9+L10)(C1\cdot C2/(C1+C2)+C3)\}} \quad \text{(Equation 5)}$$

In Embodiment 6, since the third connecting device 15 is made to have a large inductance value, the combined inductance (L9+L10) can be made to be extremely large.

Below, a comparison is made between calculated values of the resonance frequency of the semiconductor module of the prior art structure (FIG. 18) and calculated values of the resonance frequency of the semiconductor module according to this Embodiment 6.

In this Embodiment 6, C1, C2 and C3 are the same as those of the prior art structure, being around 10.5 pF, 10.5 pF and 0.26 pF, respectively. Also, when six gold wires with a diameter of 25 μm and length 0.5 mm are provided as the second connecting device 96, the inductance component L10 generated in the second connecting device 96 becomes around 0.1 nH.

Meanwhile, a chip-type inductance element having an inductance L9 of 33 nH is employed as the third connecting device 15.

Therefore, from Equation 5, it can be understood that the resonance frequency fr of the resonance circuit is around 370 MHz, enabling a shift to a frequency band lower than a 1–2 GHz channel band, which is the band used in public communications, and further enabling the avoidance of resonance in the 1–2 GHz channel band.

Figure 12:
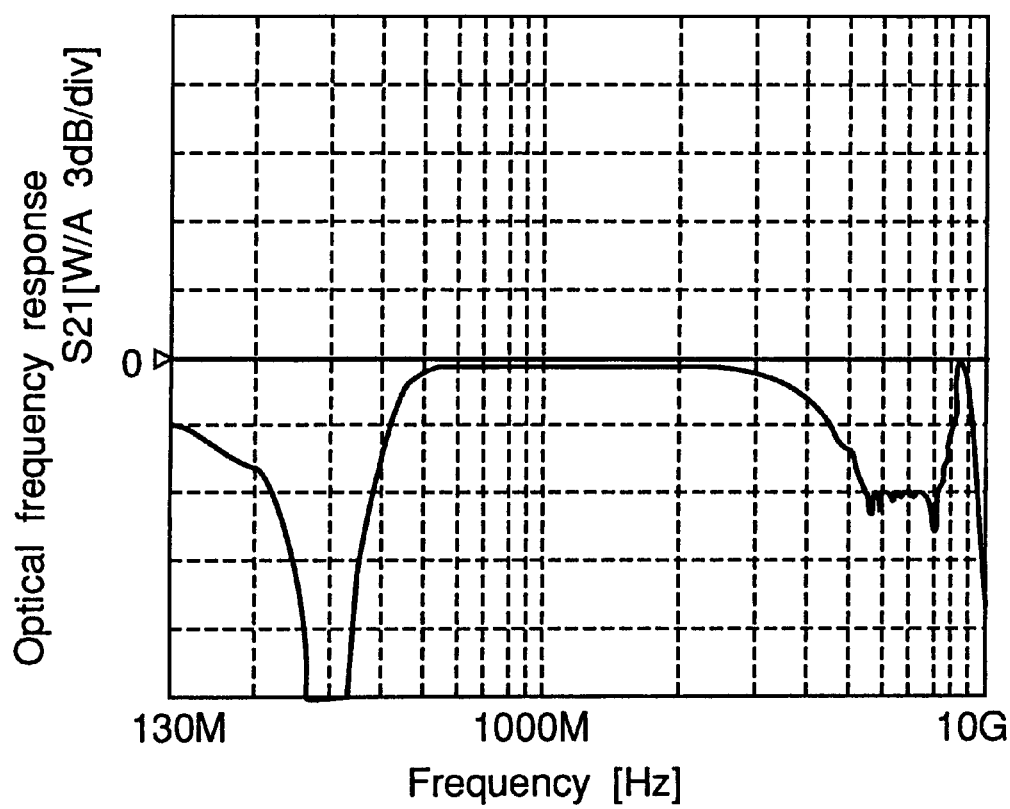
FIG. 12 shows a small-signal optical frequency response characteristic of the semiconductor laser module with an electronic cooling device according to Embodiment 6 of the invention.

FIG. 12 shows measurement results of a small-signal optical frequency response of the semiconductor laser module according to this Embodiment 6, in which the third and second connecting device 15, 96 are used for the ground line. In the figure, the vertical axis represents optical frequency response and the horizontal axis represents frequency.

As apparent from FIG. 12, the measurement results well agree with the foregoing calculation results, where the center frequency at which the optical frequency response deteriorates due to a resonance phenomenon can be shifted to a lower band around 300 MHz, from around 1.6 GHz of the semiconductor laser module of the prior art structure, by which deterioration in the modulation characteristic in frequency regions over 700 MHz has been improved.

Meanwhile, since the second connecting device is a bonding wire having a thin diameter of 25 μm, the heat resistance between the module package 1 and the chip-mounted carrier 3 can be increased as it would conventionally be.

Accordingly, the heat transfer between them can be suppressed low, which in turn makes it possible to obtain a sufficient cooling effect.

As shown above, according to Embodiment 6, it becomes possible to shift the resonance frequency of the semiconductor module to a lower band without decreasing the heat exchange efficiency of the Peltier element, and to prevent deterioration in modulation characteristics in the 0.8–2 GHz channel band that is the band used for public communications, by virtue of the arrangement that the ground line is formed by electrically connecting in series the module package 1 and the chip-mounted carrier 3 to each other with the third connecting device 15 connected to the inner bottom portion of the module package 1, and the conductive second connecting device 96 functioning to connect the third connecting device and the chip-mounted carrier to each other and having a small cross-sectional area.

In addition, although a chip-type inductance element has been used as the third electrical connecting device 15 in this Embodiment 6, it is also possible to select one or two or more in combination, which allows a specified inductance value to be obtained, from among a group consisting of a chip-type inductance element, a coil, a lead line, wire and metal transmission line. For example, if the metallized transmission line 7 on the ceramic insert 6, the hole 10 and the like as shown in FIG. 18 are used as part of the third connecting device, then a module having a structure approximate to the prior art counterpart can be implemented.

Also, although the inductance value of the third connecting device has been 33 nH in this Embodiment 6, the third connecting device may be one having a specified inductance value other than this value. That is, if a third connecting device having an inductance value of 10 nH or more, the resonance frequency can be made under about 700 MHz.

Figure 13:
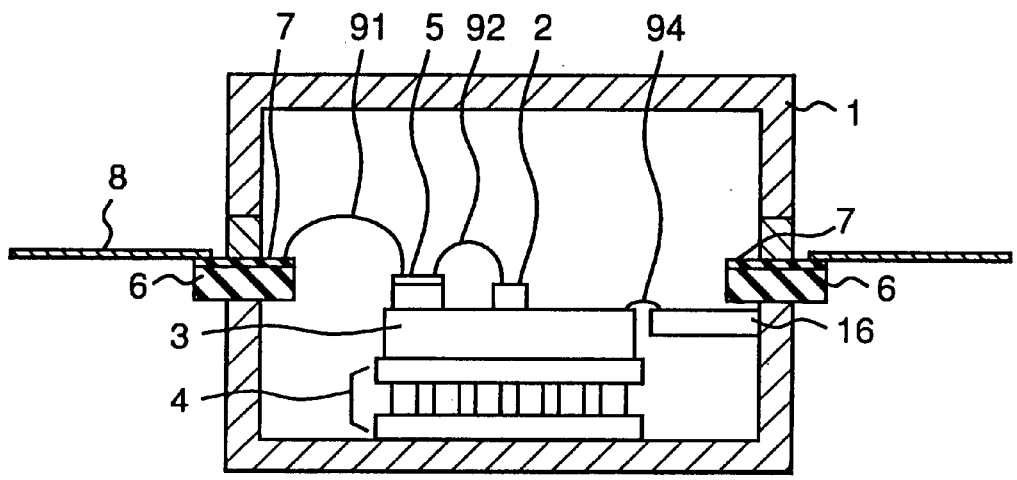
FIG. 13 is a cross-sectional arrangement diagram of a semiconductor laser module with an electronic cooling device according to Embodiment 7 of the invention.

Embodiment 7:

The present invention provides a semiconductor laser module with an electronic cooling device in which module the parasitic inductance (L3+L4) of the ground line shown in FIG. 18 is reduced and the resonance frequency is shifted to a higher band without decreasing the cooling effect of the semiconductor laser module. FIG. 13 shows a cross-sectional arrangement diagram of a semiconductor laser module according to Embodiment 7 of the invention. In the figure, parts of the same reference numerals as in FIG. 1 are the same or corresponding parts.

This Embodiment 7 shown in FIG. 13 differs from the prior art structure shown in FIG. 18 in that the chip-mounted carrier 3 and the module package 1 are connected to each other not via the bonding wire 93, the metallized transmission line 7 and via hole 10, but via the conductive first and second connecting device 16, 94.

In this case, the first connecting device 16 is a platy metallic block integrally formed with the module package 1 and electrically connected to the module package 1, being structured so as to projectively extend from a side wall of the module package 1 directly to near the chip-mounted carrier 3 without intervention of the metallized transmission line 7 or the like. Also, the second connecting device 94 is, for example, a bonding wire that electrically connects the first connecting device 16 and the chip-mounted carrier 3 to each other.

The electrical equivalent circuit of the semiconductor laser module according to Embodiment 7 shown in FIG. 13 is as shown in FIG. 2, as in the case of Embodiment 1.

The resonance frequency of the electrical equivalent circuit according to this embodiment can be expressed by Equation 2 as in Embodiment 1.

In this case, since the first connecting device 16 is integrally formed with the module package 1 and formed of a platy metallic block having a sufficiently large cross-sectional area, the inductance generated in the first connecting device 16 becomes extremely small so that L6 can be reduced.

Also, since the first connecting device 16 is so structured as to projectively extend from the module package 1 to near the chip-mounted carrier 3, the conductive second connecting device 94 comprising, for example, wire bonding that connects the first connecting device 16 and the chip-mounted carrier 3 to each other can be reduced in length. Even if this second connecting device 94 is formed of, for example, a bonding wire having a small cross-sectional area, occurrence of a parasitic inductance that depends on its length can be reduced so that L5 can be reduced.

Below is shown a comparison between calculated values of resonance frequency of the semiconductor module having the prior art structure and calculated values of resonance frequency of the semiconductor laser module according to this embodiment.

In the prior art structure, the electrode pad 5 is usually made from a material having a low relative dielectric constant such as alumina, the size being 1.8×1.8×1.0 mm, where C3 becomes around 0.26 pF. Also, the upper and lower dielectric plates of the Peltier element 4 are sized 6×10×0.45 mm, where C1 and C2 become around 10.5 pF. The bonding wire 93 is usually formed into six parallel gold wires with a diameter of 25 μm and length about 3 mm, where L3 becomes around 0.5 nH. The contained-in-package inductance L4 generated in the metallized transmission line 7, the hole 10 and the module package 1 becomes around 1.2 nH.

Therefore, substituting these values into the Equation 1 results in a resonance frequency fr of around 1.6 GHz, well agreeing with measurement values shown in FIG. 19.

In contrast to this, in this embodiment, C1, C2 and C3 are the same as those of the prior art structure, being around 10.5 pF, 10.5 pF and 0.26 pF, respectively. Also, when six gold wires with a diameter of 25 μm and a length of 0.5 mm are provided as the second connecting device 94, the inductance component L5 generated in the second connecting device 94 becomes around 0.1 nH.

Meanwhile, the inductance component L6 contained in the package including the first connecting device can be estimated to be around 0.1 nH.

Therefore, from Equation 2, it can be understood that the resonance frequency fr is around 4.8 GHz, enabling the avoidance of resonance in a 1–2 GHz channel band.

Figure 14:
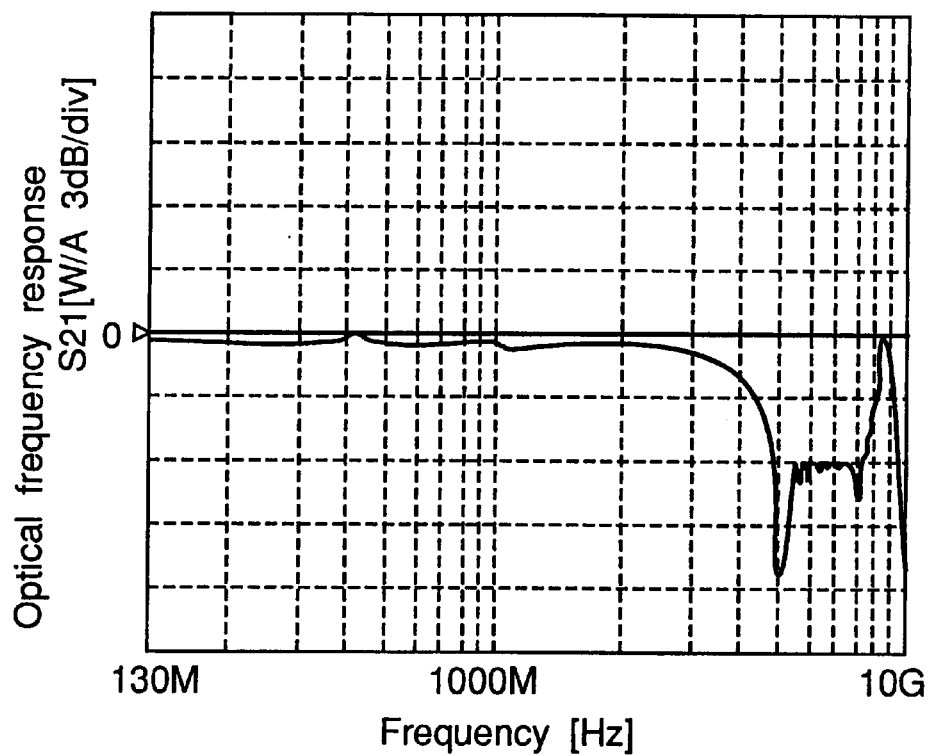
FIG. 14 shows a small-signal optical frequency response characteristic of the semiconductor laser module with an electronic cooling device according to Embodiment 7 of the invention.

FIG. 14 shows measurement results of a small-signal optical frequency response of a semiconductor module formed by using the first and second connecting device 16, 94. In the figure, the vertical axis represents the optical frequency response and the horizontal axis represents the frequency.

As apparent from FIG. 14, the measurement results well agree with the foregoing calculation results, where the center frequency at which the optical frequency response due to the resonance phenomenon is shifted to a higher band, from around 1.6 GHz of the prior art structure to around 5 GHz, by which the margins of modulation characteristic are improved. Meanwhile, since the second connecting device 94 is a bonding wire having a thin diameter of 25 μm, the heat resistance between the module package 1 and the chip-mounted carrier 3 can be increased.

Accordingly, the heat transfer between them can be suppressed low, which in turn makes it possible to prevent the heat circulating-flow phenomenon that heat radiated from the lower surface of the Peltier-element electronic cooling device to the module package 1 is flowed back to the chip-mounted carrier 3 by passing through the first and second connecting device, and therefore to obtain a sufficient cooling effect without decreasing the heat exchange efficiency of the Peltier-element electronic cooling device 4.

As shown above, according to this embodiment, it becomes possible to shift the resonance frequency of the semiconductor module to a higher band without decreasing the heat exchange efficiency of the Peltier element, and to improve the modulation margins, by virtue of the arrangement that the ground line is formed by electrically connecting in series the module package 1 and the chip-mounted carrier 3 to each other with the conductive first connecting device 16 projectively extending from the module package 1 to near the chip-mounted carrier 3 and having a large cross-sectional area, and the conductive second connecting device 94 operable to connect the first connecting device and the chip-mounted carrier to each other, being short, and having a small cross-sectional area.

In addition, although bonding wire has been used as the second connecting device 94 in this embodiment, ribbon wire may be used alternatively, and the diameter, number and length of the bonding wire or the like are arbitrarily selectable.

Also, although the first electrical connecting device 16 has been a platy metallic block integrated with the module package in this embodiment, it may alternatively be formed by fit with a rigid connecting device free from re-stripping such as gas welding.

Further, it is possible to fix the platy metallic block after aligning the Peltier-element electronic cooling device 4, chip-mounted carrier 3, condenser lens, optical isolator, optical fiber and the like, for which optical-axis adjustment is required, and fixedly setting these members in place, in the fabricating process of the semiconductor module, so that the working space necessary for the work such as the alignment of those necessary members can be ensured. Also, since this platy metallic block is removable, the working space can be ensured also when the alignment of the members is needed again.

Furthermore, the module package is preferably a butterfly type package, and especially preferably a butterfly type package equipped with a ceramic insert passing through opposite side walls of the module package and having a metallized transmission line patterned at its surface.

Figure 15:
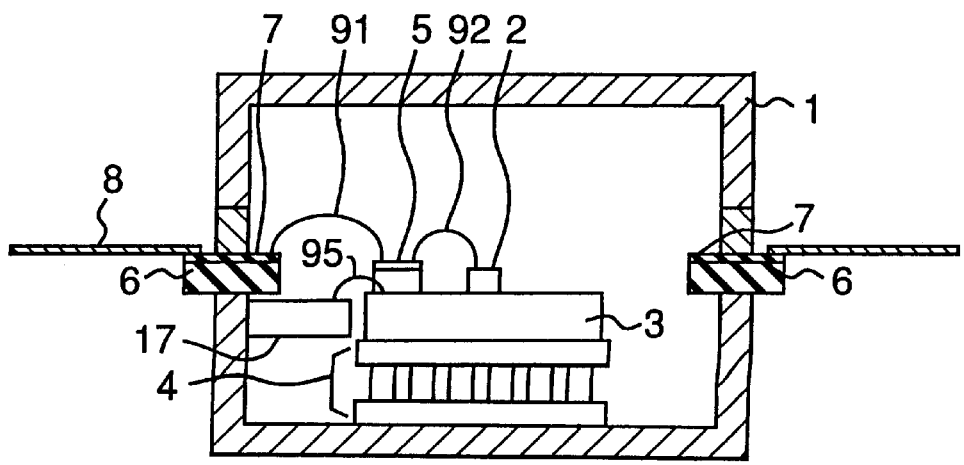
FIG. 15 is a cross sectional arrangement diagram of a semiconductor laser module with an electronic cooling device according to Embodiment 8 of the invention.

Embodiment 8:

FIG. 15 is a cross-sectional arrangement diagram of a semiconductor laser module according to Embodiment 8 of the invention. In the figure, the same reference numerals as those of FIG. 13 denote the same or corresponding parts. This embodiment differs from Embodiment 7 shown in FIG. 13 in that the first connecting device 17 is projected from a side wall of the module package on the ceramic insert side (left side of the figure) having the transmission line for input of a modulation signal.

The electrical equivalent circuit diagram and the small signal optical frequency response characteristics according to this Embodiment 8 are similar to those of Embodiment 7 (FIG. 14).

Thus, in Embodiment 8, the position where the first connecting device is provided can be changed from one side opposite to the modulation signal input side as shown in Embodiment 7 to the modulation signal input side, without deteriorating the small-signal optical frequency response characteristics. As a result, it becomes possible to obtain a greater degree of freedom for formation of the module structure in which the resonance frequency has been shifted to a higher band so that the modulation margins have been improved.

In addition, although the first connecting device 17 is projected only from the modulation signal input side in this embodiment, it may also be projected also from the side opposite to the modulation signal input side as shown in Embodiment 7, in which case the degree of freedom for formation of the ground line can be increased.

Figure 16:
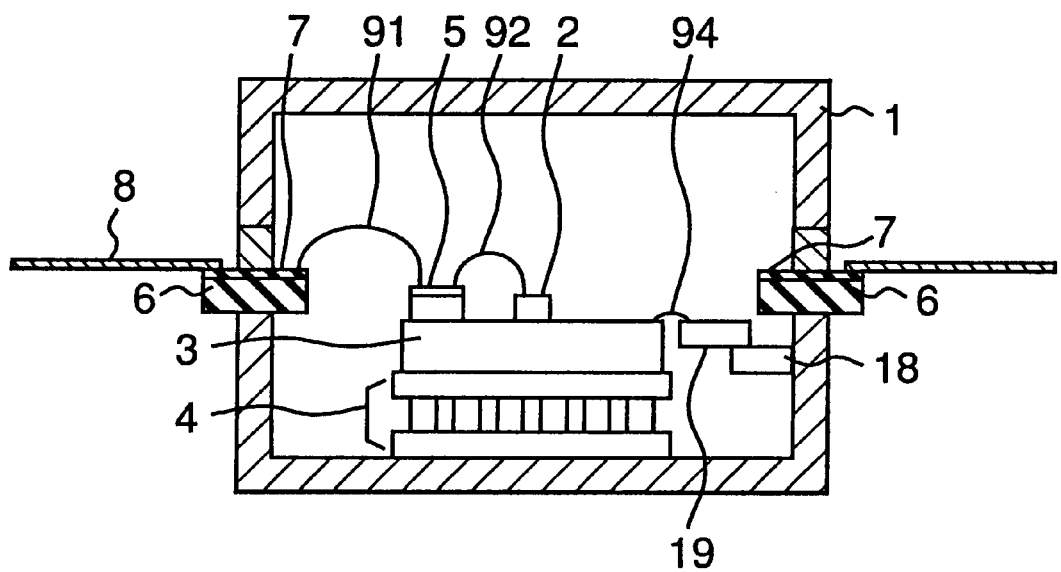
FIG. 16 is a cross-sectional arrangement diagram of a semiconductor laser module with an electronic cooling device according to Embodiment 9 of the invention.

Embodiment 9:

FIG. 16 is a cross-sectional arrangement diagram of a semiconductor laser module according to Embodiment 9 of the invention. In the figure, the same reference numerals as those of FIG. 13 denote the same or corresponding parts. This embodiment differs from FIG. 13 in that the first connecting device comprises first and second platy metallic blocks 18, 19.

The first platy metallic block 18 is so structured as to be projected from the side wall of the module package into its interior by a few mm. The second platy metallic block 19 is connected to the first platy metallic block by solder connection, being projected to near the chips mounted carrier.

The electrical equivalent circuit diagram and the small signal optical frequency response characteristics according to this embodiment are similar to those of Embodiment 7 (FIG. 14).

In this embodiment, the second platy metallic block 19 of an arbitrary length is removably fitted by solder connection to the first platy metallic block 18 fixed to the module package 1. Therefore, the second platy metallic block 19 can be fitted after aligning the Peltier-element electronic cooling device 4, chip-mounted carrier 3, condenser lens, optical isolator, optical fiber and the like, for which optical-axis adjustment is required, and fixedly setting these members in place, in the fabricating process of the semiconductor module, so that the working space can be ensured.

Also, when there has arisen a need of re-adjustment of the members, the second platy metallic block 19 can be easily removed so that the working space can be ensured.

In particular, in this embodiment, since the second platy metallic block 19 that can be fitted and removed after the adjustment of members and the like is connected by welding or the like to the first platy metallic block 18 that has previously been provided, the work is facilitated as compared with the case where it is connected directly to the side wall of the module package 1 as in Embodiment 7.

In Embodiments 1 to 9, bonding wire has been used as the second connecting device, but ribbon wire may be used instead. The diameter, number, length and the like of the bonding wire can be selected arbitrarily depending on the embodiment.

Furthermore, the module package is preferably a butterfly type package, and especially preferably a butterfly type package equipped with a ceramic insert passing through opposite side walls of the module package and having a metallized transmission line patterned at its surface.

What is claimed is:

1. A semiconductor laser module with an electronic cooling device comprising:
    a semiconductor laser diode;
    a chip-mounted carrier on which said semiconductor laser diode is mounted;
    an electronic cooling device on which said chip-mounted carrier is mounted, and which absorbs heat from said chip-mounted carrier;
    a module package in which said electronic cooling device is mounted on its inner bottom portion and from which the heat absorbed by said electronic cooling device is released;
    a modulation signal transmitting device operable to transmit an input modulation signal of a specified frequency to said semiconductor laser diode; and
    a ground line electrically connecting said module package and said chip-mounted carrier to each other;
    wherein an inductance of said ground line is changed so that a resonance frequency of a resonance circuit made up by including said ground line is shifted so as to deviate from a specified frequency band used by said modulation signal transmitting device;
    wherein said modulation signal transmitting device comprises an input terminal formed through a side wall of said module package; and
    wherein said module package is a butterfly type module package.

2. A semiconductor laser module with an electronic cooling device as claimed in claim 1, wherein said chip-mounted carrier and said module package are electrically conductive.

3. A semiconductor laser module with an electronic cooling device as claimed in claim 1, wherein said ground line comprises:
    a conductive first connecting device projectively extending from an inner bottom portion of said module package to near said chip-mounted carrier and having an large cross-sectional area, and a conductive second connecting device operable to connect said first connecting device and said chip-mounted carrier to each other and having a small cross-sectional area;
    wherein the inductance of said ground line is reduced so that the resonance frequency is shifted to a band higher than the frequency band.

4. A semiconductor laser module with an electronic cooling device as claimed in claim 3, wherein said first connecting device is formed integrally with the inner bottom portion of said module package.

5. A semiconductor laser module with an electronic cooling device as claimed in claim 4, wherein said first connecting device comprises a connection bottom portion which projectively extends to a height near a top surface of said chip-mounted carrier and to the top surface of which said second connecting device is connected.

6. A semiconductor laser module with an electronic cooling device as claimed in claim 3, wherein said first connecting device is a platy metallic block fixed to said module package by a removable fixing device.

7. A semiconductor laser module with an electronic cooling device as claimed in claim 6, wherein said platy metallic block is made from an alloy composed mainly of nickel, iron, and cobalt or an alloy composed mainly of copper and tungsten.

8. A semiconductor laser module with an electronic cooling device as claimed in claim 1, wherein said ground line comprises:
    a conductive second connecting device operable to connect said module package and said chip-mounted carrier to each other and having a small cross-sectional area; or
    a third connecting device provided on said module package and having a specified inductance value, and a conductive second connecting device operable to connect said third connecting device and said chip-mounted carrier to each other and which has a small cross-sectional area;
    wherein the inductance of said ground line is increased so that the resonance frequency is shifted to a band lower than the frequency band.

9. A semiconductor laser module with an electronic cooling device as claimed in claim 8, wherein the inductance of said ground line is at least 10 nH.

10. A semiconductor laser module with an electronic cooling device as claimed in claim 1, wherein said ground line comprises:
    a third connecting device provided on said module package and having a specified inductance value, and a conductive second connecting device operable to connect said third connecting device and said chip-mounted carrier to each other and which has a small cross-sectional area;
    wherein the inductance of said ground line is increased so that the resonance frequency is shifted to a band lower than the frequency band; and
    wherein said third connecting device comprises one or more in combination selected from a group consisting of coil, inductance chip, lead line, wire, and metal transmission line.

11. A semiconductor laser module with an electronic cooling device as claimed in claim 3, wherein said second connecting device comprises a bonding wire or a ribbon wire.

12. A semiconductor laser module with an electronic cooling device as claimed in claim 1, wherein said ground line comprises:
    a conductive first connecting device projectively extending from said module package to near said chip-mounted carrier and having a large cross-sectional area, and a conductive second connecting device operable to connect said first connecting device and said chip-mounted carrier to each other and having a small cross-sectional area;
    wherein the resonance frequency is shifted so as to deviate from the frequency band.

13. A semiconductor laser module with an electronic cooling device as claimed in claim 12, wherein said first connecting device is a platy metallic block fixed to said module package by a removable fixing device.

14. A semiconductor laser module with an electronic cooling device as claimed in claim 12, wherein said first connecting device comprises a first platy metallic block fixed to said module package and a second platy metallic block removably fixed to said first platy metallic block.

15. A semiconductor laser module with an electronic cooling device as claimed in claim 13, wherein said platy metallic block is made from an alloy composed mainly of nickel, iron, and cobalt, or an alloy composed mainly of copper and tungsten.

16. A semiconductor laser module with an electronic cooling device as claimed in claim 12, wherein said second connecting device comprises a bonding wire or a ribbon wire.

17. A semiconductor laser module with an electronic cooling device as claimed in claim 1, wherein said electronic cooling device comprises dielectric substrates being kept in contact with said chip-mounted carrier and said module package, respectively, and made from a ceramic material composed mainly of any one of alumina ($Al_2O_3$), aluminum nitride (AlN), and calcium titanate ($CaTiO_3$), and a Peltier element sandwiched between said dielectric substrates.

18. A semiconductor laser module with an electronic cooling device as claimed in claim 1, wherein said modulation signal transmitting device comprises a metal transmission line formed on a ceramic insert passing through said module package or a coaxial connector fixed to said module package.

19. A semiconductor laser module with an electronic cooling device as claimed in claim 1, wherein an optical fiber operable to lead output light derived from said semiconductor laser diode to outside is connected to said semiconductor laser diode.

20. A semiconductor laser module with an electronic cooling device as claimed in claim 2, wherein said ground line comprises:

a conductive first connecting device projectively extending from an inner bottom portion of said module package to near said chip-mounted carrier and having a large cross-sectional area, and a conductive second connecting device operable to connect said first connecting device and said chip-mounted carrier to each other and having a small cross-sectional area;

wherein the inductance of said ground line is reduced so that the resonance frequency is shifted to a band higher than the frequency band.

21. A semiconductor laser module with an electronic cooling device as claimed in claim 2, wherein said ground line comprises:

a conductive second connecting device operable to connect said module package and said chip-mounted carrier to each other and having a small cross-sectional area; or a third connecting device provided on said module package and having a specified inductance value, and a conductive second connecting device operable to connect said third connecting device and said chip-mounted carrier to each other and which has a small cross-sectional area;

wherein the inductance of said ground line is increased so that the resonance frequency is shifted to a band lower than the frequency band.

22. A semiconductor laser module with an electronic cooling device as claimed in claim 8, wherein said second connecting device comprises a bonding wire or a ribbon wire.

23. A semiconductor laser module with an electronic cooling device as claimed in claim 2, wherein said ground line comprises:

a conductive first connecting device projectively extending from said module package to near said chip-mounted carrier and having a large cross-sectional area, and a conductive second connecting device operable to connect said first connecting device and said chip-mounted carrier to each other and having small cross-sectional area;

wherein the resonance frequency is shifted so as to deviate from the frequency band.

24. A semiconductor laser module with an electronic cooing device as claimed in claim 2, wherein said electronic cooling device comprises dielectric substrates being kept in contact with said chip-mounted carrier and said module package, respectively, and made from a ceramic material composed mainly of any one of alumina ($Al_2O_3$), aluminum nitride (AlN) and calcium titanate ($CaTiO_3$), and a Peltier element sandwiched between said dielectric substrates.

25. A semiconductor laser module with an electronic cooling device as claimed in claim 2, wherein said modulation signal transmitting device comprises a metal transmission line formed on a ceramic insert passing through said module package or a coaxial connector fixed to said module package.

26. A semiconductor laser module with an electronic cooling device as claimed in claim 2, wherein an optical fiber operable to lead output light derived from said semiconductor laser diode to outside is connected to said semiconductor laser diode.

* * * * *